United States Patent
Zhang et al.

(10) Patent No.: US 11,502,268 B2
(45) Date of Patent: Nov. 15, 2022

(54) ELECTRON TRANSPORT LAYER INCLUDING STACKED ELECTRON TRANSPORT FILM, AND METHOD OF MANUFACTURING THE SAME, LIGHT-EMITTING DEVICE AND DISPLAY APPARATUS

(71) Applicants: ORDOS YUANSHENG OPTOELECTRONICS CO., LTD., Inner Mongolia (CN); BOE TECHNOLOGY GROUP CO., LTD., Beijing (CN)

(72) Inventors: Zhao Zhang, Beijing (CN); Ruichao Liu, Beijing (CN); Xiaofeng Zhang, Beijing (CN); Xuelu Wang, Beijing (CN)

(73) Assignees: ORDOS YUANSHENG OPTOELECTRONICS CO., LTD., Inner Mongolia (CN); BEIJING BOE TECHNOLOGY DEVELOPMENT CO., LTD., Beijing (CN)

( * ) Notice: Subject to any disclaimer, the term of this patent is extended or adjusted under 35 U.S.C. 154(b) by 184 days.

(21) Appl. No.: 16/963,777

(22) PCT Filed: Dec. 25, 2019

(86) PCT No.: PCT/CN2019/128231
§ 371 (c)(1),
(2) Date: Jul. 21, 2020

(87) PCT Pub. No.: WO2020/173203
PCT Pub. Date: Sep. 3, 2020

(65) Prior Publication Data
US 2021/0384454 A1 Dec. 9, 2021

(30) Foreign Application Priority Data
Feb. 28, 2019 (CN) .......................... 201910150041.1

(51) Int. Cl.
H01L 29/08 (2006.01)
H01L 51/50 (2006.01)
H01L 51/56 (2006.01)

(52) U.S. Cl.
CPC ............ H01L 51/508 (2013.01); H01L 51/56 (2013.01); *H01L 2251/558* (2013.01)

(58) Field of Classification Search
CPC .................................................... H01L 51/508
See application file for complete search history.

(56) References Cited

U.S. PATENT DOCUMENTS 8,809,848 B1* 8/2014 Yang ...................... H01L 51/504
257/88
9,768,404 B1* 9/2017 Steckel ............... H01L 51/5096
(Continued)

FOREIGN PATENT DOCUMENTS

CN 106611821 A 5/2017
CN 107154462 A 9/2017
(Continued)

OTHER PUBLICATIONS

First Office Action for related CN App. No. 201910150041.1 dated Mar. 3, 2020. English translation provided; 14 pages.
(Continued)

*Primary Examiner* — Caleb E Henry
(74) *Attorney, Agent, or Firm* — Procopio, Cory, Hargreaves & Savitch LLP

(57) ABSTRACT

An electron transport layer includes a first electron transport film and a second electron transport film. The second electron transport film is disposed at a side of the first electron transport film and is stacked with the first electron transport film. An energy level of a conduction band of a material included in the second electron transport film is greater than an energy level of a conduction band of a
(Continued)

material included in the first electron transport film, and the energy level of the conduction band of the material included in the second electron transport film is less than an energy level of a conduction band of a material included in the light-emitting layer.

15 Claims, 4 Drawing Sheets

(56) References Cited

U.S. PATENT DOCUMENTS

| | | | | |
|---|---|---|---|---|
| 10,381,589 | B2* | 8/2019 | Mishima | H01L 51/5076 |
| 10,566,564 | B2* | 2/2020 | Lee | H01L 51/502 |
| 11,139,441 | B2* | 10/2021 | Chang | H01L 51/0052 |
| 2011/0215301 | A1* | 9/2011 | Forrest | H01L 51/5036 |
| | | | | 438/45 |
| 2015/0228921 | A1* | 8/2015 | Kambe | H01L 51/5278 |
| | | | | 438/46 |
| 2016/0104854 | A1* | 4/2016 | Jeon | H01L 51/5016 |
| | | | | 257/40 |
| 2017/0117480 | A1 | 4/2017 | Oh et al. | |
| 2018/0019371 | A1* | 1/2018 | Steckel | H01L 33/502 |
| 2019/0131557 | A1* | 5/2019 | Lee | H01L 51/5096 |
| 2019/0372044 | A1 | 12/2019 | Qiao et al. | |

FOREIGN PATENT DOCUMENTS

| | | |
|---|---|---|
| CN | 107403870 A | 11/2017 |
| CN | 108539034 A | 9/2018 |
| CN | 109755405 A | 5/2019 |

OTHER PUBLICATIONS

Second Office Action for related CN App. No. 201910150041.1 dated Nov. 11, 2020. English translation provided; 16 pages.

* cited by examiner

ELECTRON TRANSPORT LAYER INCLUDING STACKED ELECTRON TRANSPORT FILM, AND METHOD OF MANUFACTURING THE SAME, LIGHT-EMITTING DEVICE AND DISPLAY APPARATUS

CROSS-REFERENCE TO RELATED APPLICATIONS

This application is a national phase entry under 35 USC 371 of International Patent Application No. PCT/CN2019/128231 filed on Dec. 25, 2019, which claims priority to Chinese Patent Application No. 201910150041.1, filed on Feb. 28, 2019, which are incorporated herein by reference in their entirety.

TECHNICAL FIELD

The present disclosure relates to the field of display technologies, and in particular, to an electron transport layer and a method of manufacturing the same, a light-emitting device and a display apparatus.

BACKGROUND

Organic light-emitting diode (OLED) displays are a type of display equipment that uses current to drive light-emitting devices to realize image display, which have excellent characteristics such as self-emission, no backlight, high contrast, thin thickness, wide viewing angle and fast response speed.

SUMMARY

In one aspect, an electron transport layer is provided. The electron transport layer includes a first electron transport film and a second electron transport film. The second electron transport film is disposed at a side of the first electron transport film and is stacked with the first electron transport film. An energy level of a conduction band of a material included in the second electron transport film is greater than an energy level of a conduction band of a material included in the first electron transport film, and the energy level of the conduction band of the material included in the second electron transport film is less than an energy level of a conduction band of a material included in the light-emitting layer.

In some embodiments, an energy level of a valence band of the material included in the second electron transport film is less than an energy level of a valence band of the material included in the first electron transport film.

In some embodiments, a thickness of the second electron transport film is less than a thickness of the first electron transport film.

In some embodiments, a molar ratio of the material included in the second electron transport film to the material included in the first electron transport film is in a range from 1:5 to 1:3.

In some embodiments, the first electron transport film includes a ZnO film, a $TiO_2$ film or a $SnO_2$ film.

In some embodiments, the second electron transport film includes a $ZrO_2$ film, a $La_2O_3$ film or a $LaTi_2O_7$ film.

In another aspect, a method of manufacturing an electron transport layer is provided. The method is used to manufacture the electron transport layer as described in some of the above embodiments. The electron transport layer is applied to a light-emitting device, the light-emitting device includes a light-emitting layer, and the electron transport layer is disposed at a side of the light-emitting layer. The method includes: stacking the first electron transport film and the second electron transport film together. The first electron transport film is disposed at a side of the second electron transport film away from the light-emitting layer. The energy level of the conduction band of the material included in the first electron transport film is less than the energy level of the conduction band of the material included in the second electron transport film, and the energy level of the conduction band of the material included in the second electron transport film is less than the energy level of the conduction band of the material included in the light-emitting layer.

In some embodiments, the step of stacking the first electron transport film and the second electron transport film together, includes: forming the first electron transport film on a base by using a film forming process; and forming the second electron transport film on a surface of the first electron transport film facing away from the base by using a film forming process.

In some embodiments, the step of stacking the first electron transport film and the second electron transport film together, includes: forming the first electron transport film by using a film forming process; forming the second electron transport film by using a film forming process; and combining the first electron transport film and the second electron transport film together.

In some embodiments, the first electron transport film includes a ZnO film. The step of forming the first electron transport film by using a film forming process, includes: adding an ethanol solution of diethanolamine into an ethanol suspension of zinc acetate; performing a heat treatment to obtain a diethanolamine complex colloidal solution; removing ethanol contained in the diethanolamine complex colloidal solution; preparing a preformed zinc oxide film from the ethanol-removed diethanolamine complex colloidal solution by using the film forming process; and performing an oxidation treatment on diethanolamine complex contained in the preformed zinc oxide film to form the ZnO film.

In some embodiments, a molar ratio of diethanolamine contained in an ethanol solution of diethanolamine to zinc acetate contained in an ethanol suspension of zinc acetate is in a range from 1:1.5 to 1:1.

In some embodiments, the second electron transport film includes a $ZrO_2$ film. The step of forming the second electron transport film by using a film forming process, includes: adding ammonia water dropwise to an ethanol suspension of zirconium oxychloride octahydrate under a heat condition to obtain a hydrolyzed zirconium colloidal solution; removing ethanol contained in the hydrolyzed zirconium colloidal solution; preparing a preformed zirconium dioxide film from the ethanol-removed hydrolyzed zirconium colloidal solution by using the film forming process; and performing an oxidation treatment on the preformed zirconium dioxide film to form the $ZrO_2$ film.

In some embodiments, the step of forming the second electron transport film by using the film forming process, further includes: before adding ammonia water dropwise to the ethanol suspension of zirconium oxychloride octahydrate, mixing absolute ethanol with water to obtain an ethanol aqueous solution; and mixing the ethanol aqueous solution with the zirconium oxychloride octahydrate to obtain the ethanol suspension of zirconium oxychloride octahydrate. A volume ratio of the absolute ethanol to the water is in a range from 1:4 to 1:2.5.

In yet another aspect, a light-emitting device is provided. The light-emitting device includes the electron transport layer as described in some of the above embodiments, and a light-emitting layer disposed at a side of the second electron transport film away from the first electron transport film. The electron transport layer includes the first electron transport film and the second electron transport film that are stacked. The second electron transport film is configured to be in contact with the light-emitting layer. An energy level of a conduction band of a material included in the light-emitting layer is greater than the energy level of the conduction band of the material included in the second electron transport film.

In some embodiments, the light-emitting device further includes: an electron injection layer disposed at a side of the electron transport layer away from the light-emitting layer; an exciton adjustment layer disposed at a side of the light-emitting layer away from the electron transport layer; a hole transport layer disposed at a side of the exciton adjustment layer away from the light-emitting layer; and a hole injection layer disposed at a side of the hole transport layer away from the light-emitting layer. The exciton adjustment layer is configured to adjust transport efficiency of holes that are transported to the light-emitting layer, so that exciton recombination of holes and electrons that are transported to the light-emitting layer occurs in the light-emitting layer as much as possible.

In yet another aspect, a display apparatus is provided. The display apparatus includes a plurality of light-emitting devices as described in some of the above embodiments.

BRIEF DESCRIPTION OF THE DRAWINGS

In order to describe technical solutions in the present disclosure more clearly, accompanying drawings to be used in some embodiments of the present disclosure will be introduced briefly. Obviously, the accompanying drawings to be described below are merely accompanying drawings of some embodiments of the present disclosure, and a person of ordinary skill in the art may obtain other drawings according to these drawings. In addition, the accompanying drawings in the following description may be regarded as schematic diagrams, and are not limitations on actual sizes of products, an actual process of a method, etc. involved in the embodiments of the present disclosure.

DETAILED DESCRIPTION

Technical solutions in some embodiments of the present disclosure will be described clearly and completely with reference to accompanying drawings. Obviously, the described embodiments are merely some but not all embodiments of the present disclosure. All other embodiments obtained on a basis of embodiments of the present disclosure by a person of ordinary skill in the art shall be included in the protection scope of the present disclosure.

Unless the context requires otherwise, throughout the specification and the claims, the term "comprise" and other forms thereof such as the third-person singular form "comprises" and the present participle form "comprising" are construed as an open and inclusive meaning, i.e., "included, but not limited to". In the description of the specification, terms such as "one embodiment", "some embodiments", "exemplary embodiments", "example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment or example. In addition, the specific features, structures, materials or characteristics may be included in any one or more embodiments/examples in any suitable manner.

Terms such as "first" and "second" are only used for descriptive purposes, and are not to be construed as indicating or implying the relative importance or implicitly indicating the number of indicated technical features below. Thus, features defined as "first" and "second" may explicitly or implicitly include one or more of the features. In the description of the embodiments of the present disclosure, the term "a/the plurality of" means two or more unless otherwise specified.

Figure 1:
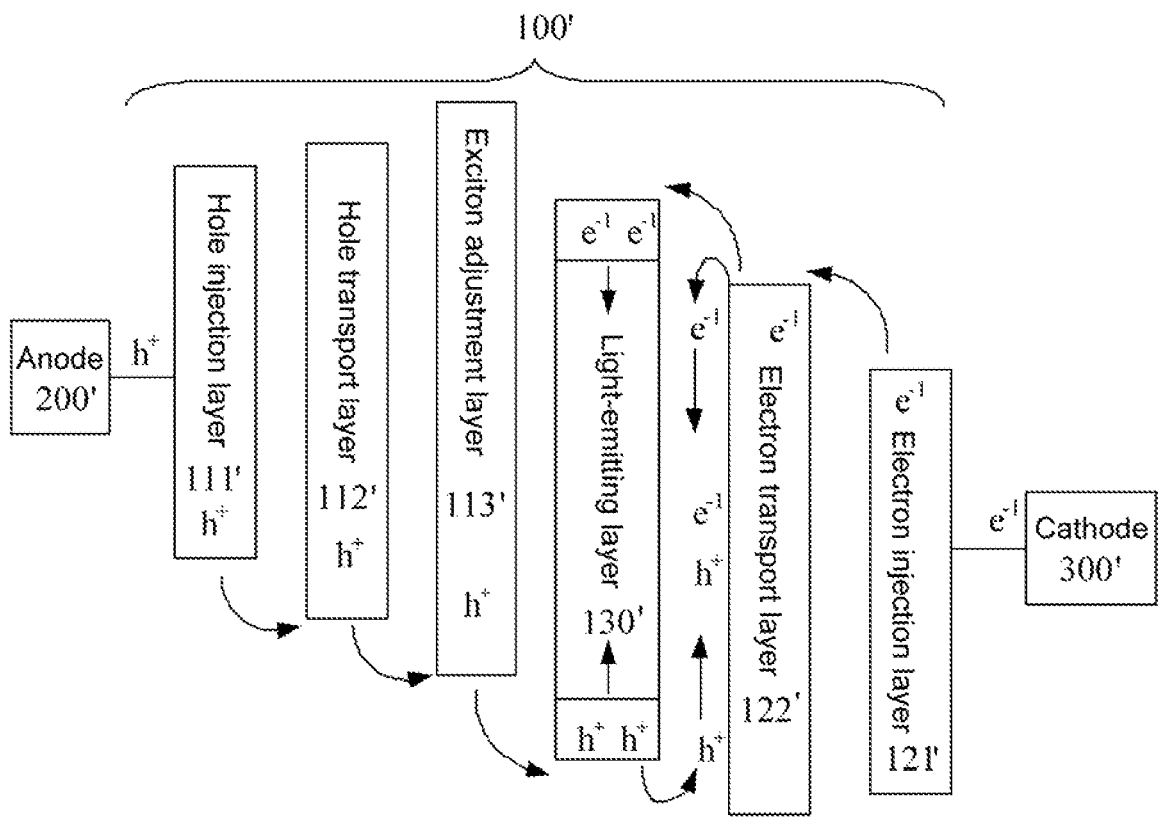
FIG. 1 is a structural diagram of a light-emitting device in the related art.

As shown in FIG. 1, in the related art, a light-emitting device includes an anode 200', a cathode 300' and a light-emitting functional layer 100' disposed between the anode 200' and the cathode 300'. The light-emitting functional layer 100' includes a hole injection layer 111', a hole transport layer 112', a light-emitting layer 130', an electron transport layer 122', and an electron injection layer 121'. In general, in a case where a certain voltage is applied to the light-emitting functional layer 100' by the anode 200' and the cathode 300', holes may move to a valence band of the light-emitting layer 130' through a valence band of a material included in the hole injection layer 111' and a valence band of a material included in the hole transport layer 112', and electrons may move to a conduction band of the light-emitting layer 130' through a conduction band of a material included in the electron injection layer 121' and a conduction band of a material included in the electron transport layer 122', so that exciton recombination of electrons and holes occurs in the light-emitting layer 130'.

In the related art, a material used for the electron transport layer 122' is generally metal oxide such as ZnO. The metal oxide such as ZnO has high conductivity and high transmittance, and plays an active role in the development of electron transport materials. Although the electron transport layer 122' made of metal oxide may effectively promote the electron transport speed, the movement of electrons in the conduction band of the metal oxide to the light-emitting layer 130' still needs to cross a large potential barrier, which is subject to the structural characteristics of energy band of the metal oxide. This may easily lead to lower electron transport efficiency relative to hole transport efficiency, resulting in a mismatch between the number of electrons and the number of holes, and thereby exciton recombination occurs at an interface between the light-emitting layer 130' and the electron transport layer 122', reducing efficiency and stability of the light-emitting device.

Figure 8:
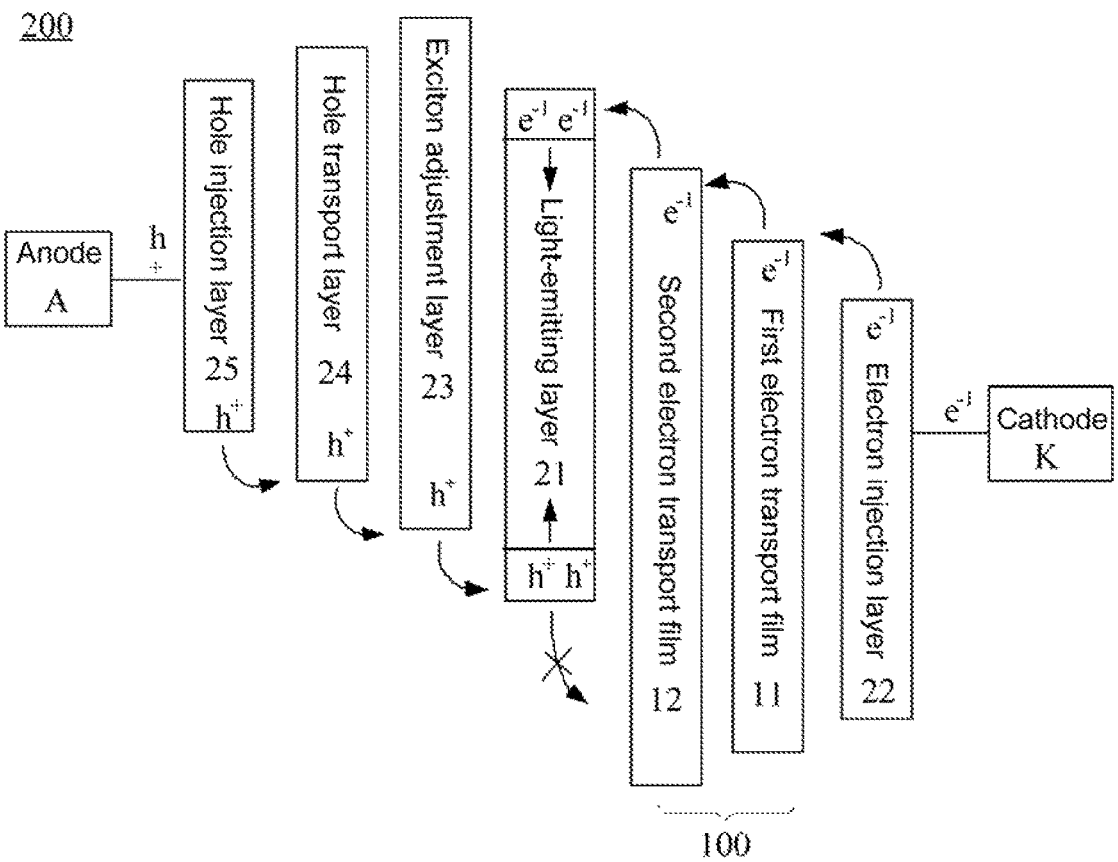
FIG. 8 is a structural diagram of a light-emitting device, in accordance with some embodiments of the present disclosure.
Figure 9:
FIG. 9 is a structural diagram of a display apparatus, in accordance with some embodiments of the present disclosure.

As shown in FIG. 9, some embodiments of the present disclosure provide a display apparatus 300. The display apparatus 300 includes a plurality of light-emitting devices 200. As shown in FIG. 8, a light-emitting device 200 includes a hole injection layer 25, a hole transport layer 24, a light-emitting layer 21, an electron transport layer 100 and an electron injection layer 22. The light-emitting device 200 further includes an exciton adjustment layer 23 disposed between the hole transport layer 24 and the light-emitting layer 21. The exciton adjustment layer 23 is able to adjust transport efficiency of holes that are transported to the light-emitting layer 21, so that exciton recombination occurs in the light-emitting layer 21 as much as possible. Herein, with respect to the electron transport layer 122' in the related art, in the display apparatus 300 provided by embodiments of the present disclosure, the electron transport efficiency of the electron transport layer 100 included in the light-emitting device 200 is relatively high.

The electron transport layer 100 provided by the embodiments of the present disclosure will be illustrated below.

Figure 2:
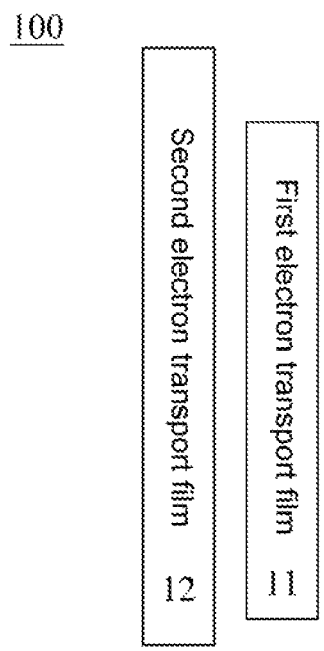
FIG. 2 is a structural diagram of an electron transport layer, in accordance with some embodiments of the present disclosure.

As shown in FIGS. 2 and 8, embodiments of the present disclosure provide an electron transport layer 100. The electron transport layer 100 is applied to the light-emitting device 200. The light-emitting device 200 includes the light-emitting layer 21 disposed at a side of the electron transport layer 100.

In some embodiments, as shown in FIGS. 2 and 8, the electron transport layer 100 includes a first electron transport film 11 and a second electron transport film 12. The second electron transport film 12 is disposed at a side of the first electron transport film 11 proximate to the light-emitting layer 21 and is stacked with the first electron transport film 11, and the second electron transport film 12 is configured to be in contact with the light-emitting layer 21. An energy level of a conduction band of a material included in the first electron transport film 11 is less than an energy level of a conduction band of a material included in the second electron transport film 12, and the energy level of the conduction band of the material included in the second electron transport film 12 is less than an energy level of a conduction band of a material included in the light-emitting layer 21.

The first electron transport film 11 and the second electron transport film 12 are able to form a heterojunction which improves the electron transport efficiency of the electron transport layer 100, and thus the number of electrons transported to the light-emitting layer 21 matches the number of holes transported to the light-emitting layer 21. Therefore, the luminescence efficiency of the light-emitting layer 21 may be improved.

In a case where the electron transport layer 100 provided by the embodiments of the present disclosure is applied to the light-emitting device 200, the second electron transport film 12 is disposed between the light-emitting layer 21 and the first electron transport film 11, and the first electron transport film 11 is disposed between the electron injection layer 22 and the second electron transport film 12. When the light-emitting device 200 emits light, electrons in the conduction band of a material included in the electron injection layer 22 first move to the conduction band of the material included in the first electron transport film 11, then move from the conduction band of the material included in the first electron transport film 11 to the conduction band of the material included in the second electron transport film 12, and finally move from the conduction band of the material included in the second electron transport film 12 to the conduction band of the material included in the light-emitting layer 21. Correspondingly, holes move to a valence band of the material included in the light-emitting layer 21. In this way, the exciton recombination of holes and the electrons occurs in the light-emitting layer 21, and energy released by the exciton recombination is released in a form of light, and thus the light-emitting device 200 emits light.

Based on the structure and application of the electron transport layer 100 provided by the embodiments of the present disclosure, it will be seen that, by providing the second electron transport film 12 at a side of the first electron transport film 11 proximate to the light-emitting layer 21, the second electron transport film 12 is in contact with the light-emitting layer 21, and the energy level of the conduction band of the material included in the first electron transport film 11 is less than the energy level of the conduction band of the material included in the second electron transport film 12, and the energy level of the conduction band of the material included in the second electron transport film 12 is less than the energy level of the conduction band of the material included in the light-emitting layer 21. In this way, a difference value between the energy level of the conduction band of the material included in the first electron transport film 11 and the energy level of the conduction band of the material included in the second electron transport film 12 is less than a difference value between the energy level of the conduction band of the material included in the first electron transport film 11 and the energy level of the conduction band of the material included in the light-emitting layer 21; and a difference value between the energy level of the conduction band of the material included in the second electron transport film 12 and the energy level of the conduction band of the material included in the light-emitting layer 21 is also less than the difference value between the energy level of the conduction band of the material included in the first electron transport film 11 and the energy level of the conduction band of the material included in the light-emitting layer 21.

In this case, with respect to a potential barrier for movement of electrons in the conduction band of the material included in the first electron transport film 11 to the conduction band of the material included in the light-emitting layer 21, a potential barrier for movement of electrons in the conduction band of the material included in the first electron transport film 11 to the conduction band of the material included in the second electron transport film 12 is relatively low. Moreover, a potential barrier between the conduction band of the material included in the second electron transport film 12 and the conduction band of the material included in the light-emitting layer 21 is relatively low. In this way, electrons in the conduction band of the material included in the first electron transport film 11 may easily move to the conduction band of the material included in the second electron transport film 12, and then may easily move to the conduction band of the material included in the light-emitting layer 21 that has a higher energy level on the basis of the conduction band of the material included in the second electron transport film 12.

In the electron transport layer 100 provided by the embodiments of the present disclosure, electrons in the conduction band of the material included in the first electron transport film 11 may rapidly move to the conduction band of the material included in the light-emitting layer 21 by taking the conduction band of the material included in the second electron transport film 12 as a springboard of movement, so that the electron transport efficiency of the electron transport layer 100 may be effectively improved. In this way, when holes move into the light-emitting layer 21, more electrons move into the light-emitting layer 21, and the matching between the number of electrons moving to the light-emitting layer 21 and the number of holes moving to the light-emitting layer 21 may be effectively improved, so that the exciton recombination process occurs in the light-emitting layer 21 as much as possible to reduce probability that the exciton recombination occurs at an interface between the electron transport layer 100 and the light-emitting layer 21. Therefore, the efficiency and stability of the light-emitting device 200 may be effectively improved.

In addition, with respect to the potential barrier for movement of electrons in the conduction band of the material included in the first electron transport film 11 to the conduction band of the material included in the light-emitting layer 21, the potential barrier for movement of electrons in the conduction band of the material included in the first electron transport film 11 to the conduction band of the material included in the second electron transport film 12 is relatively low, and the potential barrier between the conduction band of the material included in the second electron transport film 12 and the conduction band of the material included in the light-emitting layer 21 is relatively low. As a result, the electron transport efficiency may be improved without applying a large voltage to the light-emitting device 200, and a movement of holes from the valence band of the material included in the light-emitting layer 21 to the electron transport layer 100 is blocked. Therefore, the probability that the exciton recombination occurs at the interface between the second electron transport film 12 and the light-emitting layer 21 may be reduced, and the luminescence efficiency of the light-emitting device 200 may be improved.

In some embodiments, as shown in FIG. 8, an energy level of a valence band of the material included in the second electron transport film 12 is less than an energy level of a valence band of the material included in the first electron transport film 11. In this way, in a case where the electron transport layer 100 is applied to the light-emitting device 200, a potential barrier for movement of holes in the valence band of the material included in the light-emitting layer 21 to the valence band of the material included in the second electron transport film 12 is relatively high, thereby increasing difficulty of moving holes to an interface between the light-emitting layer 21 and the electron transport layer 100, and reducing the amount of holes moving to the interface between the light-emitting layer 21 and the electron transport layer 100. Therefore, the exciton recombination may occur in the light-emitting layer 21.

In some embodiments, since the second electron transport film 12 serves as an intermediate springboard through which electrons in the conduction band of the material included in the first electron transport film 11 move to the conduction band of the material included in the light-emitting layer 21, a thickness of the second electron transport film 12 may be selectively set according to actual needs, which is not limited in the embodiments of the present disclosure.

In some examples, a thickness of the first electron transport film 11 is greater than the thickness of the second electron transport film 12. In this way, a thickness of the light-emitting device 200 having the electron transport layer 100 is substantially maintained unchanged or is increased less, and it is possible to avoid an influence on a lightweight and thin design of a display apparatus (e.g., an organic electroluminescent display) having the light-emitting device 200.

In some embodiments, a molar ratio of the material included in the second electron transport film 12 to the material included in the first electron transport film 11 is in a range from 1:5 to 1:3. In this way, it may be ensured that electrons have a high moving rate, so that electrons in the conduction band of the material included in the second electron transport film 12 may move to the conduction band of the material included in the light-emitting layer 21 rapidly. Herein, for example, the molar ratio of the material included in the second electron transport film 12 to the material included in the first electron transport film 11 is 1:4, 1:3 or 1:5.

In some embodiments, the first electron transport film 11 includes a ZnO (zinc oxide) film, a $TiO_2$ (titanium dioxide) film or a $SnO_2$ (tin oxide) film, and of course, it is not limited thereto. In this case, the material included in the first electron transport film 11 may include ZnO, $TiO_2$ or $SnO_2$.

In some embodiments, the second electron transport film 12 includes a $ZrO_2$ (zirconium dioxide) film, a $La_2O_3$ (lanthanum oxide) film or a $LaTi_2O_7$ (lanthanum titanium oxide) film, and of course, it is not limited thereto. In this case, the material included in the second electron transport film 12 may include $ZrO_2$, $La_2O_3$ or $LaTi_2O_7$.

Figure 3:
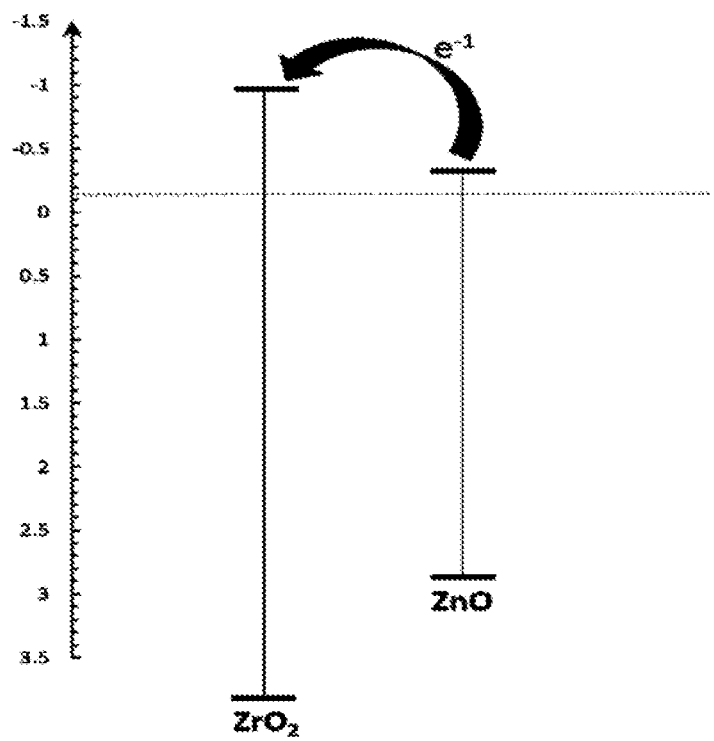
FIG. 3 is an energy level diagram of a material included in an electron transport layer, in accordance with some embodiments of the present disclosure.

For example, the first electron transport film 11 is a ZnO film, and the ZnO film has characteristics such as high conductivity and high light transmittance. The second electron transport film 12 is a $ZrO_2$ film. Of course, the second electron transport film 12 may also be a $La_2O_3$ film or a $LaTi_2O_7$ film. FIG. 3 shows an energy level matching relationship between ZnO and $ZrO_2$, and a unit of the energy level is eV. As can be seen from FIG. 3, $ZrO_2$ has a higher energy level of conduction band and a lower energy level of valence band compared with ZnO. In a case where the second electron transport film 12 is a $ZrO_2$ film, electrons in the conduction band of the material included in the first electron transport film 11 may easily move to the conduction band of the material included in the second electron transport film 12, thereby improving the transport efficiency of electrons from the electron transport layer 100 to the light-emitting layer 21.

Some embodiments of the present disclosure provide a method of manufacturing an electron transport layer, and the method is used to manufacture the electron transport layer as provided in some embodiments described above. The method includes S100.

In S100, the first electron transport film and the second electron transport film are stacked together. The first electron transport film is disposed at a side of the second electron transport film away from the light-emitting layer. The energy level of the conduction band of the material included in the first electron transport film is less than the energy level of the conduction band of the material included in the second electron transport film, and the energy level of the conduction band of the material included in the second electron transport film is less than the energy level of the conduction band of the material included in the light-emitting layer.

The material included in the first electron transport film includes various types. For example, the material included in the first electron transport film may be ZnO, $TiO_2$ or $SnO_2$, and of course, it is not limited thereto.

The material included in the second electron transport film includes various types. For example, the material included in the second electron transport film may be $ZrO_2$, $La_2O_3$ or $LaTi_2O_7$, and of course, it is not limited thereto.

Beneficial effects achieved by the method of manufacturing the electron transport layer provided by the embodiments of the present disclosure are the same as the beneficial effects achieved by the electron transport layer 100 provided by the above embodiments, which will not be described herein again.

In the S100, the method of stacking the first electron transport film and the second electron transport film together may be various, which is not limited in the embodiments of the present disclosure, and may be selected according to actual needs.

The method of stacking the first electron transport film and the second electron transport film together is, for example, that the two are stacked together during manufacturing the first electron transport film and the second electron transport film; for another example, that the first electron transport film and the second electron transport film are stacked together after the first electron transport film and the second electron transport film are separately manufactured.

The above two methods of stacking the first electron transport film and the second electron transport film together are illustrated below.

Figure 4:
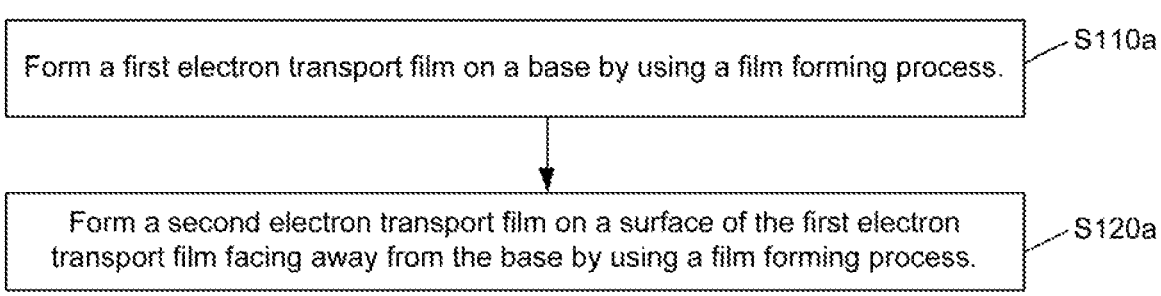
FIG. 4 is a flow diagram of a method of manufacturing an electron transport layer, in accordance with some embodiments of the present disclosure.

In some examples, in a case where the method is that the first electron transport film and the second electron transport film are stacked together during manufacturing the first electron transport film and the second electron transport film, as shown in FIG. 4, stacking the first electron transport film and the second electron transport film together, includes S110a to S120a.

In S110a, the first electron transport film is formed on a base by using a film forming process.

Herein, the film forming process is, for example, a sputtering process or an electrodeposition process, which is capable of realizing film formation of a semiconductor material (e.g., metal oxide—ZnO, $TiO_2$, $SnO_2$, etc.).

The base may be, for example, an ordinary glass substrate, or a glass substrate formed with an electron injection layer.

In a case where the base is a glass substrate formed with an electron injection layer, when the manufacturing of the electron transport layer is completed, the stacking of the electron transport layer and the electron injection layer is also completed.

In S120a, the second electron transport film is formed on a surface of the first electron transport film away from the base by using a film forming process.

Herein, the film forming process is, for example, a sputtering process or an electrodeposition process, which is capable of realizing film formation of a semiconductor material (e.g., metal oxide—$ZrO_2$, $La_2O_3$, $LaTi_2O_7$, etc.).

Figure 5:
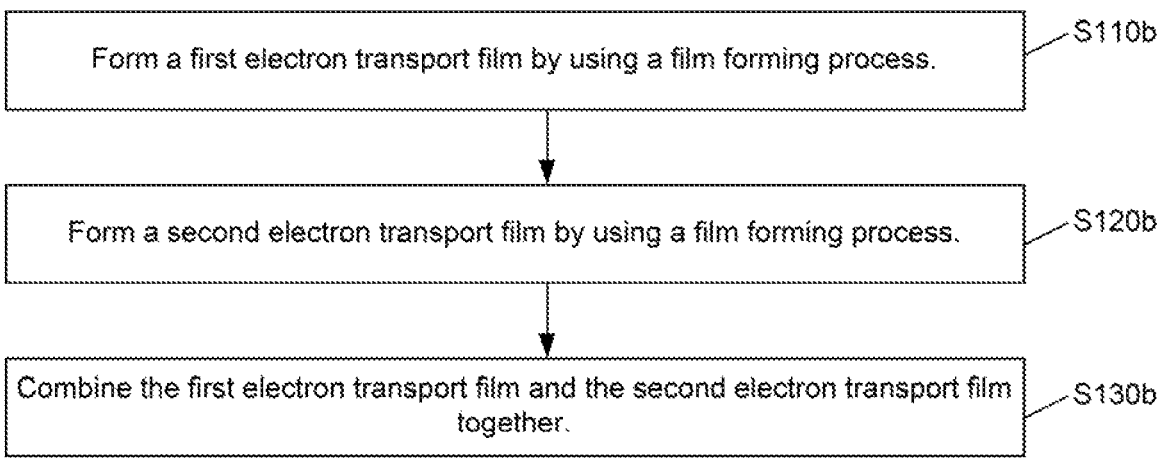
FIG. 5 is a flow diagram of another method of manufacturing an electron transport layer, in accordance with some embodiments of the present disclosure.

In some other examples, in a case where the above method is that the first electron transport film and the second electron transport film are stacked together after the first electron transport film and the second electron transport film are separately manufactured, as shown in FIG. 5, stacking the first electron transport film and the second electron transport film together, includes S110b to S130b.

In S110b, the first electron transport film is formed by using a film forming process.

Herein, the film forming process is, for example, a spin coating process; for another example, a sputtering process or an electrodeposition process, which is capable of realizing film formation of a semiconductor material (e.g., metal oxide—ZnO, $TiO_2$, $SnO_2$, etc.).

In S120b, the second electron transport film is formed by using a film forming process.

Herein, the film forming process is, for example, a spin coating process; for another example, a sputtering process or an electrodeposition process, which is capable of realizing film formation of a semiconductor material (e.g., metal oxide—$ZrO_2$, $La_2O_3$, $LaTi_2O_7$, etc.).

In S130b, the first electron transport film and the second electron transport film are combined together.

For example, the method of combining the first electron transport film and the second electron transport film is a tableting process, a laminating process, etc. Herein, during the combining process, damage to the first electron transport film and the second electron transport film should be avoided.

Figure 6:
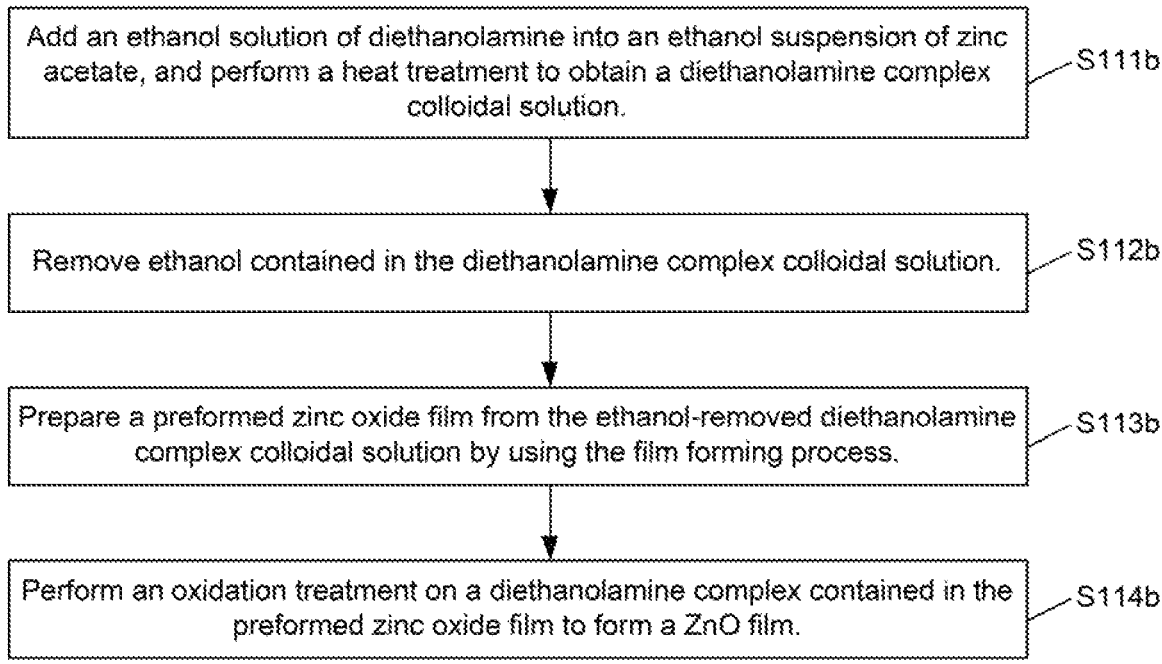
FIG. 6 is a flow diagram of a method of manufacturing a first electron transport film, in accordance with some embodiments of the present disclosure.

In the S110b, if the first electron transport film includes a ZnO film, that is, the material included in the first electron transport film includes ZnO, as shown in FIG. 6, forming the first electron transport film by using a film forming process, includes S111b to S114b.

In S111b, an ethanol solution of diethanolamine is added into an ethanol suspension of zinc acetate, and a heat treatment is performed to obtain a diethanolamine complex colloidal solution.

In the S111b, a temperature of the heat treatment is in a range from 60° C. to 80° C. In a process of the heat treatment, a coordination reaction occurs between the zinc acetate and the diethanolamine to generate a zinc diethanolamine complex. A temperature of the coordination reaction is in a range from 60° C. to 80° C.

In some examples, when the ethanol solution of diethanolamine is added to the ethanol suspension of zinc acetate, the ethanol suspension of zinc acetate is always in an excessive state relative to the ethanol solution of diethanolamine, so that the zinc acetate is always in an excessive state. Thereby, there is no free diethanolamine in the final diethanolamine complex colloidal solution.

In some embodiments, a molar ratio of the diethanolamine contained in the ethanol solution of diethanolamine to the zinc acetate contained in the ethanol suspension of zinc acetate is in a range from 1:1.5 to 1:1. In this way, when the zinc diethanolamine complex is generated, the diethanolamine may be more completely coordinated to zinc ions, and the obtained diethanolamine complex colloidal solution is clear.

In S112b, ethanol contained in the diethanolamine complex colloidal solution is removed.

After the ethanol contained in the diethanolamine complex colloidal solution is removed, a viscosity of the ethanol-removed diethanolamine complex colloidal solution may be increased. Herein, a removal method of ethanol is, for example, a drying method. A temperature of drying may be selected to be 60° C., and a time of drying is set according to actual situations, for example, the time of drying is 2 hours.

In S113b, a preformed zinc oxide film is prepared from the ethanol-removed diethanolamine complex colloidal solution by using the film forming process.

For example, the film forming process may be a casting process or a spin coating process. For example, in a case where the spin coating process is used, a rotation speed during the spin coating process may be set according to actual situations, and the rotation speed during the spin coating process may be 1000 rpm.

In S114b, an oxidation treatment is performed on diethanolamine complex contained in the preformed zinc oxide film to form the ZnO film.

For example, the oxidation treatment of the diethanolamine complex contained in the preformed zinc oxide film may be a heat treatment, and the temperature of the heat treatment may be in a range from 80° C. to 100° C. In this case, the diethanolamine complex contained in the preformed zinc oxide film is oxidized, so that the preformed zinc oxide film becomes the ZnO film.

Figure 7:
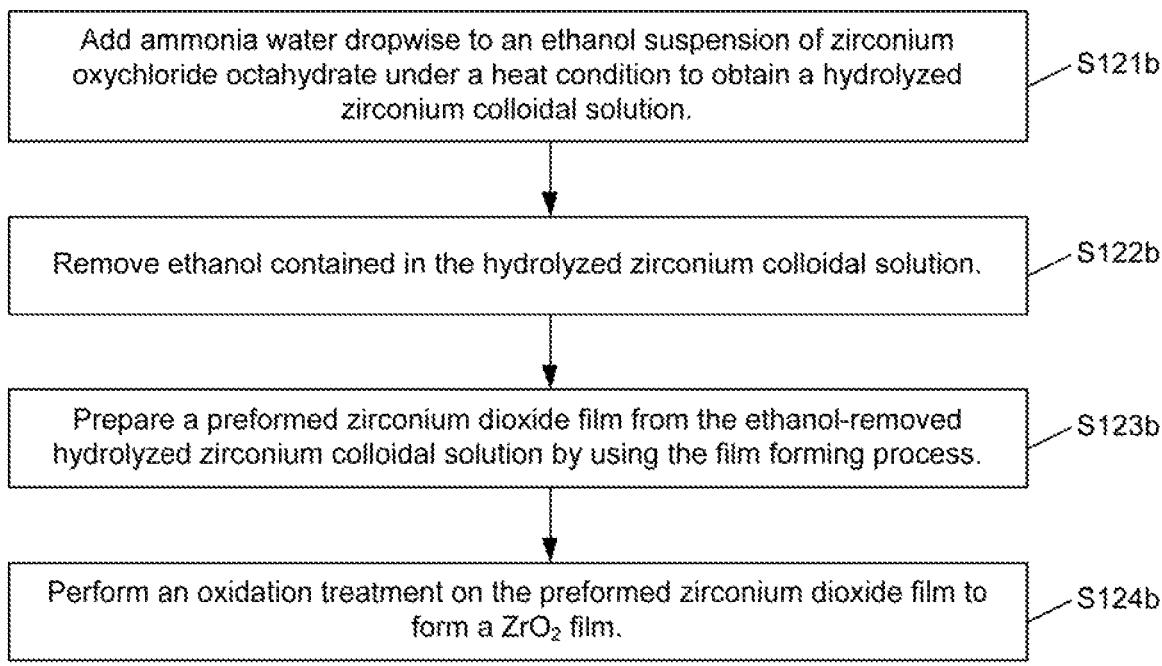
FIG. 7 is a flow diagram of a method of manufacturing a second electron transport film, in accordance with some embodiments of the present disclosure.

In the S120b, if the second electron transport film includes a $ZrO_2$ film, that is, the material included in the second electron transport film is $ZrO_2$, as shown in FIG. 7, forming the second electron transport film by using a film forming process, includes S121b to S124b.

In S121b, ammonia water is added dropwise to an ethanol suspension of zirconium oxychloride octahydrate under a heat condition to obtain a hydrolyzed zirconium colloidal solution.

Zirconium oxide contained in the hydrolyzed zirconium colloidal solution is present in a form of zirconium hydroxide. And when the hydrolyzed zirconium colloidal solution is obtained, the hydrolyzed zirconium colloidal solution is clear.

In S122b, ethanol contained in the hydrolyzed zirconium colloidal solution is removed.

After the ethanol is removed, a viscosity of the ethanol-removed hydrolyzed zirconium colloidal solution may be increased.

Herein, a removal method of ethanol is, for example, a drying method. A temperature of drying may be selected to be 60° C., and a time of drying is set according to actual situations, for example, the time of drying is 2 hours.

In S123b, a preformed zirconium dioxide film is prepared from the ethanol-removed hydrolyzed zirconium colloidal solution by using a film forming process.

For example, the film forming process may be a casting process or a spin coating process. In a case where the spin coating process is used to form the preformed zirconium dioxide film, a rotation speed during the spin coating process may be set according to actual situations, for example, the rotation speed during the spin coating process is 1000 rpm.

In S124b, an oxidation treatment is performed on the preformed zirconium dioxide film to form the $ZrO_2$ film.

For example, the oxidation treatment is a heat treatment, and the temperature of the heat treatment is in a range from 80° C. to 100° C.

In a process of the oxidation treatment, the zirconium hydroxide contained in the preformed zirconium dioxide film is oxidized, so that the preformed zirconium dioxide film becomes the $ZrO_2$ film.

In some examples, in the S120b, forming the second electron transport film by using a film forming process, further includes: before adding ammonia water dropwise to the ethanol solution of zirconium oxychloride octahydrate, mixing absolute ethanol with water to obtain an ethanol aqueous solution, and mixing the ethanol aqueous solution with the zirconium oxychloride octahydrate to obtain the ethanol suspension of zirconium oxychloride octahydrate. In this way, a solubility of zirconium oxychloride octahydrate in ethanol may be increased.

The method of manufacturing the electron transport layer will be described in detail below by taking an example where a method including S110b to S130b is used to manufacture the electron transport layer.

In some examples, the method of manufacturing the electron transport layer includes a first step to a seventh step.

In the first step, 6.6 g of zinc acetate (i.e., 0.036 mol) is weighed, then the zinc acetate is added into a beaker after being ground, and 50 mL of absolute ethanol is added into the beaker. The mixture is stirred in a water bath at 60° C. for 1 hour to obtain an ethanol suspension of the zinc acetate.

5 mL of diethanolamine (i.e., 0.052 mol) is dissolved in 15 mL of absolute ethanol to obtain an ethanol solution of diethanolamine.

The ethanol solution of diethanolamine is slowly added dropwise to the ethanol suspension of zinc acetate, and a heat treatment is performed at 60° C. to obtain a diethanolamine complex colloidal solution. In this case, the diethanolamine complex colloidal solution is clear. Then the diethanolamine complex colloidal solution is allowed to stand at room temperature for 24 hours.

In the second step, the diethanolamine complex colloidal solution is dried at 60° C. for 2 hours to remove ethanol contained in the diethanolamine complex colloidal solution.

At a rotation speed of 1000 rpm, the ethanol-removed diethanolamine complex colloidal solution is spin-coated by using a spin coating process to obtain a preformed zinc oxide film.

In the third step, a heat treatment is performed on the preformed zinc oxide film three times to obtain a ZnO film. A heat temperature of the heat treatment of each time is 90° C., and a heat time of the heat treatment of each time is 3 minutes.

In the fourth step, the absolute ethanol is mixed with water in a volume ratio of 1:3 to obtain an ethanol aqueous solution.

25 mL of the ethanol aqueous solution is mixed with 12.88 g of zirconium oxychloride octahydrate (i.e., 0.04 mol), and the mixture is stirred for 30 minutes to obtain an ethanol suspension of zirconium oxychloride octahydrate.

In the fifth step, ammonia water is added dropwise to the ethanol suspension of zirconium oxychloride octahydrate under a heat condition of 85° C. until the ethanol suspension of zirconium oxychloride octahydrate is clear. In this way, a clear hydrolyzed zirconium colloidal solution is obtained.

The hydrolyzed zirconium colloidal solution is dried at 60° C. for 2 hours to remove ethanol contained in the hydrolyzed zirconium colloidal solution.

At a rotation speed of 1000 rpm, the ethanol-removed hydrolyzed zirconium colloidal solution is spin-coated by using a spin coating process to obtain a preformed zirconium dioxide film.

In the sixth step, an oxidation treatment is performed on the preformed zirconium dioxide film at 90° C. to obtain a $ZrO_2$ film. A molar ratio of $ZrO_2$ contained in the $ZrO_2$ film to ZnO contained in the ZnO film is 1:4.

In the seventh step, the ZnO film and the $ZrO_2$ film are combined together by tableting to obtain an electron transport layer.

In some other examples, the method of manufacturing the electron transport layer includes a first step to a seventh step.

In the first step, 0.045 mol of zinc acetate is weighed, then the zinc acetate is added into a beaker after being ground, and 60 mL of absolute ethanol is added into the beaker. The mixture is stirred in a water bath at 60° C. for 2 hours to obtain an ethanol suspension of the zinc acetate.

0.045 mol of diethanolamine is dissolved in 20 mL of absolute ethanol to obtain an ethanol solution of diethanolamine.

The ethanol solution of diethanolamine is slowly added dropwise to the ethanol suspension of zinc acetate, and a heat treatment is performed at 80° C. to obtain a diethanolamine complex colloidal solution. In this case, the diethanolamine complex colloidal solution is clear. Then the diethanolamine complex colloidal solution is allowed to stand at room temperature for 24 hours.

In the second step, the diethanolamine complex colloidal solution is dried at 60° C. for 2 hours to remove ethanol contained in the diethanolamine complex colloidal solution.

At a rotation speed of 1000 rpm, the ethanol-removed diethanolamine complex colloidal solution is spin-coated by using a spin coating process to obtain a preformed zinc oxide film.

In the third step, a heat treatment is performed on the preformed zinc oxide film three times to obtain a ZnO film. A heat temperature of the heat treatment of each time is 100° C., and a heat time of the heat treatment of each time is 3 minutes.

In the fourth step, the absolute ethanol is mixed with water in a volume ratio of 1:2.5 to obtain an ethanol aqueous solution.

25 mL of the ethanol aqueous solution is mixed with 0.36 mol of zirconium oxychloride octahydrate, and the mixture is stirred for 30 minutes to obtain an ethanol suspension of zirconium oxychloride octahydrate.

In the fifth step, ammonia water is added dropwise to the ethanol suspension of zirconium oxychloride octahydrate under a heat condition of 80° C. until the ethanol suspension of zirconium oxychloride octahydrate is clear. In this way, a clear hydrolyzed zirconium colloidal solution is obtained.

The hydrolyzed zirconium colloidal solution is dried at 60° C. for 2 hours to remove ethanol contained in the hydrolyzed zirconium colloidal solution.

At a rotation speed of 1000 rpm, the ethanol-removed hydrolyzed zirconium colloidal solution is spin-coated by using a spin coating process to obtain a preformed zirconium dioxide film.

In the sixth step, an oxidation treatment is performed on the preformed zirconium dioxide film at 100° C. to obtain a $ZrO_2$ film. A molar ratio of $ZrO_2$ contained in the $ZrO_2$ film to ZnO contained in the ZnO film is 1:3.

In the seventh step, the ZnO film and the $ZrO_2$ film are combined together by tableting to obtain an electron transport layer.

In some other examples, the method of manufacturing the electron transport layer includes a first step to a seventh step.

In the first step, 0.05 mol of zinc acetate is weighed, then the zinc acetate is added into a beaker after being ground, and 60 mL of absolute ethanol is added into the beaker. The mixture is stirred in a water bath at 60° C. for 2 hours to obtain an ethanol suspension of the zinc acetate.

0.068 mol of diethanolamine is dissolved in 30 mL of absolute ethanol to obtain an ethanol solution of diethanolamine.

The ethanol solution of diethanolamine is slowly added dropwise to the ethanol suspension of zinc acetate, and a heat treatment is performed at 70° C. to obtain a diethanolamine complex colloidal solution. In this case, the diethanolamine complex colloidal solution is clear. Then the diethanolamine complex colloidal solution is allowed to stand at room temperature for 24 hours.

In the second step, the diethanolamine complex colloidal solution is dried at 60° C. for 2 hours to remove ethanol contained in the diethanolamine complex colloidal solution.

At a rotation speed of 1000 rpm, the ethanol-removed diethanolamine complex colloidal solution is spin-coated by using a spin coating process to obtain a preformed zinc oxide film.

In the third step, a heat treatment is performed on the preformed zinc oxide film three times to obtain a ZnO film. A heat temperature of the heat treatment of each time is 80° C., and a heat time of the heat treatment of each time is 3 minutes.

In the fourth step, the absolute ethanol is mixed with water in a volume ratio of 1:4 to obtain an ethanol aqueous solution.

37 mL of the ethanol aqueous solution is mixed with 0.30 mol of zirconium oxychloride octahydrate, and the mixture is stirred for 30 minutes to obtain an ethanol suspension of zirconium oxychloride octahydrate.

In the fifth step, ammonia water is added dropwise to the ethanol suspension of zirconium oxychloride octahydrate under a heat condition of 100° C. until the ethanol suspension of zirconium oxychloride octahydrate is clear. In this way, a clear hydrolyzed zirconium colloidal solution is obtained.

The hydrolyzed zirconium colloidal solution is dried at 60° C. for 2 hours to remove ethanol contained in the hydrolyzed zirconium colloidal solution.

At a rotation speed of 1000 rpm, the ethanol-removed hydrolyzed zirconium colloidal solution is spin-coated by using a spin coating process to obtain a preformed zirconium dioxide film.

In the sixth step, an oxidation treatment is performed on the preformed zirconium dioxide film at 80° C. to obtain a $ZrO_2$ film. A molar ratio of $ZrO_2$ contained in the $ZrO_2$ film to ZnO contained in the ZnO film is 1:5.

In the seventh step, the ZnO film and the $ZrO_2$ film are combined together by tableting to obtain an electron transport layer.

Some embodiments of the present disclosure further provide a light-emitting device 200. As shown in FIG. 8, the light-emitting device 200 includes the electron transport layer 100 as provided in some embodiments described above. The electron transport layer 100 includes the first electron transport film 11 and the second electron transport film 12 that are stacked. The light-emitting device 200 further includes a light-emitting layer 21 disposed at a side of the second electron transport film 12 away from the first electron transport film 11. The energy level of the conduction band of the material included in the light-emitting layer 21 is greater than the energy level of the conduction band of the material included in the second electron transport film 12.

Beneficial effects achieved by the light-emitting device 200 provided by the embodiments of the present disclosure are the same as the beneficial effects achieved by the electron transport layer 100 provided by the above embodiments, which will not be described herein again.

In some embodiments, as shown in FIG. 8, the light-emitting device 200 further includes an electron injection layer 22 disposed at a side of the electron transport layer 100 away from the light-emitting layer 21, and the first electron transport film 11 in the electron transport layer 100 is disposed between the electron injection layer 22 and the second electron transport film 12.

The light-emitting device 200 further includes an exciton adjustment layer 23, a hole transport layer 24, and a hole injection layer 25. The exciton adjustment layer 23 is disposed at a side of the light-emitting layer 21 away from the electron transport layer 100, the hole transport layer 24 is disposed at a side of the exciton adjustment layer 23 away from the light-emitting layer 21, and the hole injection layer 25 is disposed at a side of the hole transport layer 24 away from the light-emitting layer 21. The exciton adjustment layer 23 is configured to adjust the transport efficiency of holes that are transported to the light-emitting layer 21, so that exciton recombination of the holes and electrons that are transported to the light-emitting layer 21 occurs in the light-emitting layer 21 as much as possible, thereby improving the luminescence efficiency of the light-emitting device 200.

In some embodiments, as shown in FIG. 8, the light-emitting device 200 further includes an anode A and a cathode K. The anode A is connected to a side of the hole injection layer 25 away from the light-emitting layer 21, and the cathode K is connected to a side of the electron injection layer 22 away from the light-emitting layer 21. In this way, a driving voltage is provided to the light-emitting device 200 by utilizing the anode A and the cathode K to drive the light-emitting device 200 to emit light.

A structure of the light-emitting device 200 is described by taking the above structure as an example. In some embodiments, the light-emitting device 200 may not include one of the exciton adjustment layer 23, the hole transport layer 24 and the hole injection layer 25; or the light-emitting device 200 may not include the electron injection layer 22.

Some embodiments of the present disclosure provide a display apparatus 300. As shown in FIG. 9, the display apparatus 300 includes a plurality of light-emitting devices 200 as provided in some embodiments described above.

Beneficial effects achieved by the display apparatus 300 provided by the embodiments of the present disclosure are the same as the beneficial effects achieved by the light-emitting device 200 provided by some embodiments described above, which will not be described herein again.

In some embodiments, the display apparatus 300 provided by the above embodiments may be any product or component having a display function, such as a mobile phone, a tablet computer, a television, a display, a notebook computer, a digital photo frame or a navigator.

The forgoing descriptions are merely specific implementation manners of the present disclosure, but the protection scope of the present disclosure is not limited thereto. Any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. An electron transport layer, comprising:
a first electron transport film; and
a second electron transport film disposed at a side of the first electron transport film and stacked with the first electron transport film, wherein
an energy level of a conduction band of a material included in the second electron transport film is greater than an energy level of a conduction band of a material included in the first electron transport film, and the energy level of the conduction band of the material included in the second electron transport film is less than an energy level of a conduction band of a material included in a light-emitting layer;
a molar ratio of the material included in the second electron transport film to the material included in the first electron transport film is in a range from 1:5 to 1:3.

2. The electron transport layer according to claim 1, wherein an energy level of a valence band of the material included in the second electron transport film is less than an energy level of a valence band of the material included in the first electron transport film.

3. The electron transport layer according to claim 1, wherein a thickness of the second electron transport film is less than a thickness of the first electron transport film.

4. The electron transport layer according to claim 1, wherein the first electron transport film includes a ZnO film, a $TiO_2$ film or a $SnO_2$ film.

5. The electron transport layer according to claim 1, wherein the second electron transport film includes a $ZrO_2$ film, a $La_2O_3$ film or a $LaTi_2O_7$ film.

6. A method of manufacturing an electron transport layer, wherein the method is used to manufacture the electron transport layer according to claim 1, the electron transport layer is applied to a light-emitting device, the light-emitting device includes a light-emitting layer, and the electron transport layer is disposed at a side of the light-emitting layer;
the method comprising:
stacking the first electron transport film and the second electron transport film together, wherein
the first electron transport film is disposed at a side of the second electron transport film away from the light-emitting layer;
the energy level of the conduction band of the material included in the first electron transport film is less than the energy level of the conduction band of the material included in the second electron transport film, and the energy level of the conduction band of the material included in the second electron transport film is less than the energy level of the conduction band of the material included in the light-emitting layer;
a molar ratio of the material included in the second electron transport film to the material included in the first electron transport film is in a range from 1:5 to 1:3.

7. The method according to claim 6, wherein stacking the first electron transport film and the second electron transport film together, includes:
forming the first electron transport film on a base by using a film forming process; and
forming the second electron transport film on a surface of the first electron transport film facing away from the base by using a film forming process.

8. The method according to claim 6, wherein stacking the first electron transport film and the second electron transport film together, includes:
forming the first electron transport film by using a film forming process;
forming the second electron transport film by using a film forming process; and
combining the first electron transport film and the second electron transport film together.

9. The method according to claim 8, wherein the first electron transport film includes a ZnO film; and
forming the first electron transport film by using a film forming process, includes:
adding an ethanol solution of diethanolamine into an ethanol suspension of zinc acetate;
performing a heat treatment to obtain a diethanolamine complex colloidal solution;
removing ethanol contained in the diethanolamine complex colloidal solution;
preparing a preformed zinc oxide film from the ethanol-removed diethanolamine complex colloidal solution by using the film forming process; and performing an oxidation treatment on diethanolamine complex contained in the preformed zinc oxide film to form the ZnO film.

10. The method according to claim 9, wherein
a molar ratio of diethanolamine contained in an ethanol solution of diethanolamine to zinc acetate contained in an ethanol suspension of zinc acetate is in a range from 1:1.5 to 1:1.

11. The method according to claim 8, wherein the second electron transport film includes a $ZrO_2$ film; and
forming the second electron transport film by using a film forming process, includes:
adding ammonia water dropwise to an ethanol suspension of zirconium oxychloride octahydrate under a heat condition to obtain a hydrolyzed zirconium colloidal solution;
removing ethanol contained in the hydrolyzed zirconium colloidal solution;
preparing a preformed zirconium dioxide film from the ethanol-removed hydrolyzed zirconium colloidal solution by using the film forming process; and
performing an oxidation treatment on the preformed zirconium dioxide film to form the $ZrO_2$ film.

12. The method according to claim 11, wherein forming the second electron transport film by using a film forming process, further includes:
before adding ammonia water dropwise to the ethanol suspension of zirconium oxychloride octahydrate,
mixing absolute ethanol with water to obtain an ethanol aqueous solution, wherein a volume ratio of the absolute ethanol to the water is in a range from 1:4 to 1:2.5; and
mixing the ethanol aqueous solution with the zirconium oxychloride octahydrate to obtain the ethanol suspension of zirconium oxychloride octahydrate.

13. A light-emitting device, comprising:
the electron transport layer according to claim 1, the electron transport layer including the first electron transport film and the second electron transport film that are stacked; and
a light-emitting layer disposed at a side of the second electron transport film away from the first electron transport film, the second electron transport film being configured to be in contact with the light-emitting layer, wherein
an energy level of a conduction band of a material included in the light-emitting layer is greater than the energy level of the conduction band of the material included in the second electron transport film;
a molar ratio of the material included in the second electron transport film to the material included in the first electron transport film is in a range from 1:5 to 1:3.

14. The light-emitting device according to claim 13, further comprising:
an electron injection layer disposed at a side of the electron transport layer away from the light-emitting layer;
an exciton adjustment layer disposed at a side of the light-emitting layer away from the electron transport layer, the exciton adjustment layer being configured to adjust transport efficiency of holes that are transported to the light-emitting layer;
a hole transport layer disposed at a side of the exciton adjustment layer away from the light-emitting layer; and
a hole injection layer disposed at a side of the hole transport layer away from the light-emitting layer.

15. A display apparatus, comprising a plurality of light-emitting devices according to claim 13.

* * * * *